(12) United States Patent
Kim et al.

(10) Patent No.: US 7,649,313 B2
(45) Date of Patent: Jan. 19, 2010

(54) STRUCTURE FOR STABILIZING DRIVE PULSES AND PLASMA DISPLAY DEVICE USING THE SAME

(75) Inventors: Ki-Jung Kim, Suwon-si (KR); Myoung-Kon Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 679 days.

(21) Appl. No.: 11/354,857

(22) Filed: Feb. 16, 2006

(65) Prior Publication Data

US 2006/0186779 A1    Aug. 24, 2006

(30) Foreign Application Priority Data

Feb. 21, 2005    (KR) ............... 2005-14072

(51) Int. Cl.
*H01J 17/02*    (2006.01)

(52) U.S. Cl. ........................ 313/582; 313/46

(58) Field of Classification Search ................ None
See application file for complete search history.

(56) References Cited

U.S. PATENT DOCUMENTS

| | | | |
|---|---|---|---|
| 5,971,566 | A | 10/1999 | Tani et al. |
| 6,417,619 | B1 * | 7/2002 | Yasunori et al. ............ 313/582 |
| 6,429,587 | B1 * | 8/2002 | Sugimachi et al. .......... 313/582 |
| 6,522,069 | B1 | 2/2003 | Hong et al. |
| 6,686,536 | B2 * | 2/2004 | Tone et al. .................. 174/389 |
| 7,321,186 | B2 * | 1/2008 | Kim et al. .................... 313/112 |
| 7,423,377 | B2 * | 9/2008 | Kim et al. .................... 313/582 |
| 2005/0017620 | A1 | 1/2005 | Kim et al. |
| 2005/0017638 | A1 | 1/2005 | Kim |
| 2005/0179381 | A1 * | 8/2005 | Kim et al. .................... 313/582 |

FOREIGN PATENT DOCUMENTS

| | | |
|---|---|---|
| EP | 1 519 217 A1 | 3/2005 |
| JP | 2001-305971 | 11/2001 |
| KR | 2001-16915 | 3/2001 |

OTHER PUBLICATIONS

Search Report issued in the European Patent Application No. 06110138.2 on Aug. 22, 2006.
Office Action issued by the Chinese Patent Office in Chinese Patent Application No. 2006100041219 on Apr. 18, 2008.

* cited by examiner

*Primary Examiner*—Ashok Patel
(74) *Attorney, Agent, or Firm*—Stein McEwen, LLP

(57) ABSTRACT

A plasma display device (PDP), and a structure stabilizing drive pulses in a PDP the structure including a panel, a chassis base which is mounted on an upper part of the panel to form a current path and dissipates heat, a case the dissipates the heat in connection with the chassis base, a chassis reinforcing member mounted on an upper part of the chassis base, a driving circuit substrate mounted on an upper part of the chassis reinforcing member, a signal transmitting element that transmits signals between the driving circuit substrate and the panel, and a carbon group thermal conductive sheet that is interposed between the panel and the chassis base to electrically connect the panel to the chassis base, and grounded to the chassis base. The carbon group thermal conductive sheet reduces inductance between the panel and the chassis base, and accordingly, the generation of an electromotive force, which affects the driving pulses, is reduced, thereby enabling a stable panel discharge.

18 Claims, 5 Drawing Sheets

STRUCTURE FOR STABILIZING DRIVE PULSES AND PLASMA DISPLAY DEVICE USING THE SAME

CROSS-REFERENCE TO RELATED APPLICATION

This application claims the benefit of Korean Patent Application No. 2005-14072, filed on Feb. 21, 2005 in the Korean Intellectual Property Office, the disclosure of which is incorporated herein in its entirety by reference.

BACKGROUND OF THE INVENTION

1. Field of the Invention

An aspect of the present invention relates to a plasma display device (PDP), and more particularly, to a structure for stabilizing drive pulses in a PDP, in which a carbon group thermal conductive sheet is interposed between a panel and a chassis and is grounded to the chassis base, and a plasma display device having the same.

2. Description of the Related Art

A plasma display panel (PDP) assembly is a flat display device that displays images using light emitted from an excited fluorescent material of a fluorescent material layer formed in a discharge space filled with a discharge gas. The fluorescent material is excited when ultraviolet rays are generated by applying a predetermined voltage to discharge electrodes disposed in substrates facing each other.

The PDP assembly is manufactured by assembling separately manufactured front and rear panels, coupling a chassis base assembly to a rear surface of the PDP assembly, mounting a driving circuit substrate (driver IC) that transfers electrical signals to the PDP assembly on a surface of the chassis base assembly, and mounting these assembled elements in a case.

If there is an air layer 4 between the chassis base 12 and the rear panel 162, the air layer provides thermal resistance, and accordingly, the transfer of heat generated by the panel to the chassis base is reduced, causing the accumulation of heat in the rear panel.

Figure 1:
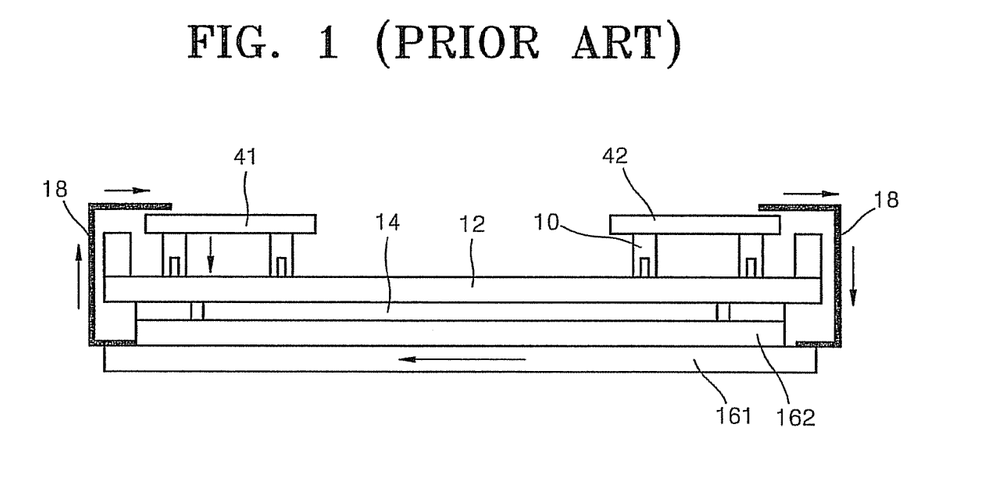
FIGS. 1 and 2 are respectively a cross-sectional view and a circuit diagram of a typical plasma display panel (PDP)
Figure 2:
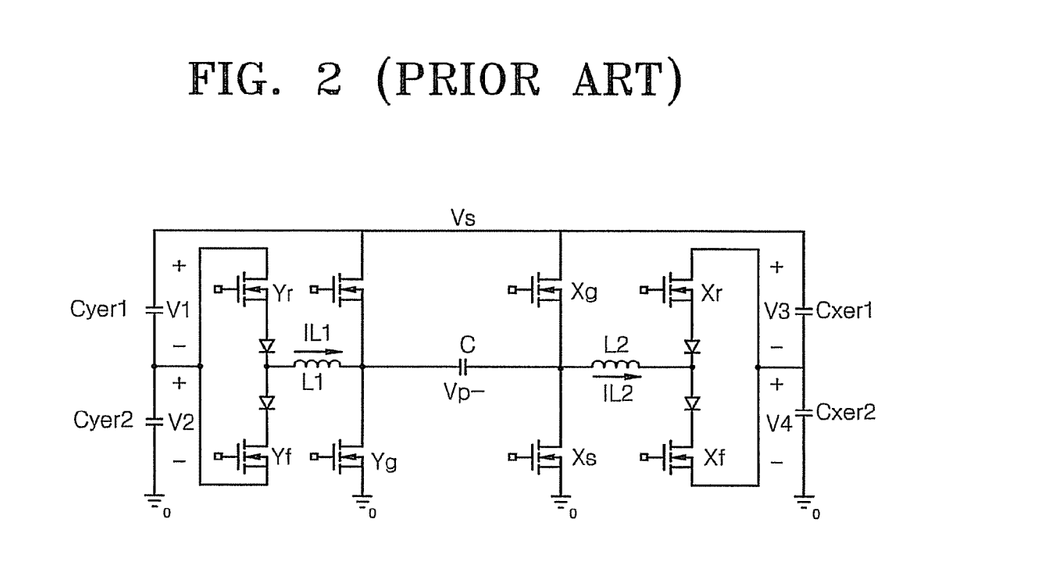

Referring to FIGS. 1 and 2, a magnetic field is generated when a current flows through a wire, and a time-varying field is generated when an alternating current flows through the wire. Accordingly, an electromotive force is induced according to Faraday's law, and the polarity of the current is opposite to the current flow according to Lenz's Law.

When a plasma display panel is driven, a current flows along the following path: Y driving board 42→signal transmitting element 18→panel electrodes 161 and 162→signal transmitting element 18→X driving board 41→chassis 12 and 10→Y driving board 42. At this time, an electromotive force is induced at both ends of each of the panel electrodes 161 and 162, and the electromotive force affects the driving waveform, resulting in unstable panel discharges. In the case of a sustain discharge, the electromotive force is repeatedly produced when the current between the X electrode and the Y electrode changes direction according to an Energy Recovery Circuit (ERC) of FIG. 2.

U.S. Pat. No. 5,971,566 discloses a thermal conductive medium and Korean Publication No. 2001-16915 discloses an electromagnetic interference (EMI) removing technique, but these patents have suggested methods of effectively shielding electromagnetic waves, and have not been able to achieve stable panel discharge through stabilized driving pulses.

SUMMARY OF THE INVENTION

An aspect of the present invention provides a structure for stabilizing drive pulses of a plasma display panel (PDP), in which a carbon group thermal conductive sheet (a graphite sheet or a carbon sheet) is interposed between a panel and a chassis and is grounded to the chassis base, and a plasma display device using the structure for stabilizing drive pulses.

According to an aspect of the present invention, there is provided a structure for stabilizing drive pulses of a plasma display device, the structure including a panel; a chassis base which is mounted on an upper part of the panel to form a current path and dissipates heat; a case that dissipates heat in connection with the chassis base; a chassis reinforcing member mounted on an upper part of the chassis base; a driving circuit substrate mounted on an upper part of the chassis reinforcing member; a signal transmitting element that transmits signals between the driving circuit substrate and the panel; and a carbon group thermal conductive sheet that is interposed between the panel and the chassis base to electrically connect the panel to the chassis base, and grounded to the chassis base.

According to another aspect of the present invention, there is provided a plasma display device having a structure for stabilizing drive pulses of the plasma display device, the structure including a panel; a chassis base which is mounted on an upper part of the panel to form a current path and dissipates heat; a case that dissipates heat in connection with the chassis base; a chassis reinforcing member mounted on an upper part of the chassis base; a driving circuit substrate mounted on an upper part of the chassis reinforcing member; a signal transmitting element that transmits signals between the driving circuit substrate and the panel; and a carbon group thermal conductive sheet that is interposed between the panel and the chassis base to electrically connect the panel to the chassis base, and grounded to the chassis base.

According to another aspect of the present invention, the structure for stabilizing drive pulses may further include a conductive element, wherein the carbon group thermal conductive sheet is divided into more than two pieces, and the divided pieces are connected to each other by the conductive element.

According to another aspect of the present invention, the conductive element may be formed by surrounding a buffering material with a conductive substance.

According to another aspect of the present invention, the conductive element may be formed by surrounding a buffering material with a mesh shape conductive substance.

According to another aspect of the present invention, the conductive element may include a buffering material which is thermal conductive and acts as a buffer, and a conductive material coated on the buffering material.

According to another aspect of the present invention, the conductive element may include a buffering material, and a conductive material surrounding the buffering material.

According to another aspect of the present invention, the conductive element may include a buffering material and a conductive mesh surrounding the buffering material.

According to another aspect of the present invention, a gap may be formed between the chassis base and the carbon group thermal conductive sheet to prevent the transfer of heat generated by the driving circuit substrate to the panel through the carbon group thermal conductive sheet.

According to another aspect of the present invention, the conductive material may be one of EMI sponge, silicon sponge, neoprene sponge, Cu or Al sheet, graphite, and BeCu mesh.

According to another aspect of the present invention, the buffering material may be silicon, rubber, a resin foam, and/or a sponge.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A plasma display device according to an embodiment of the present invention will now be described.

Figure 9:
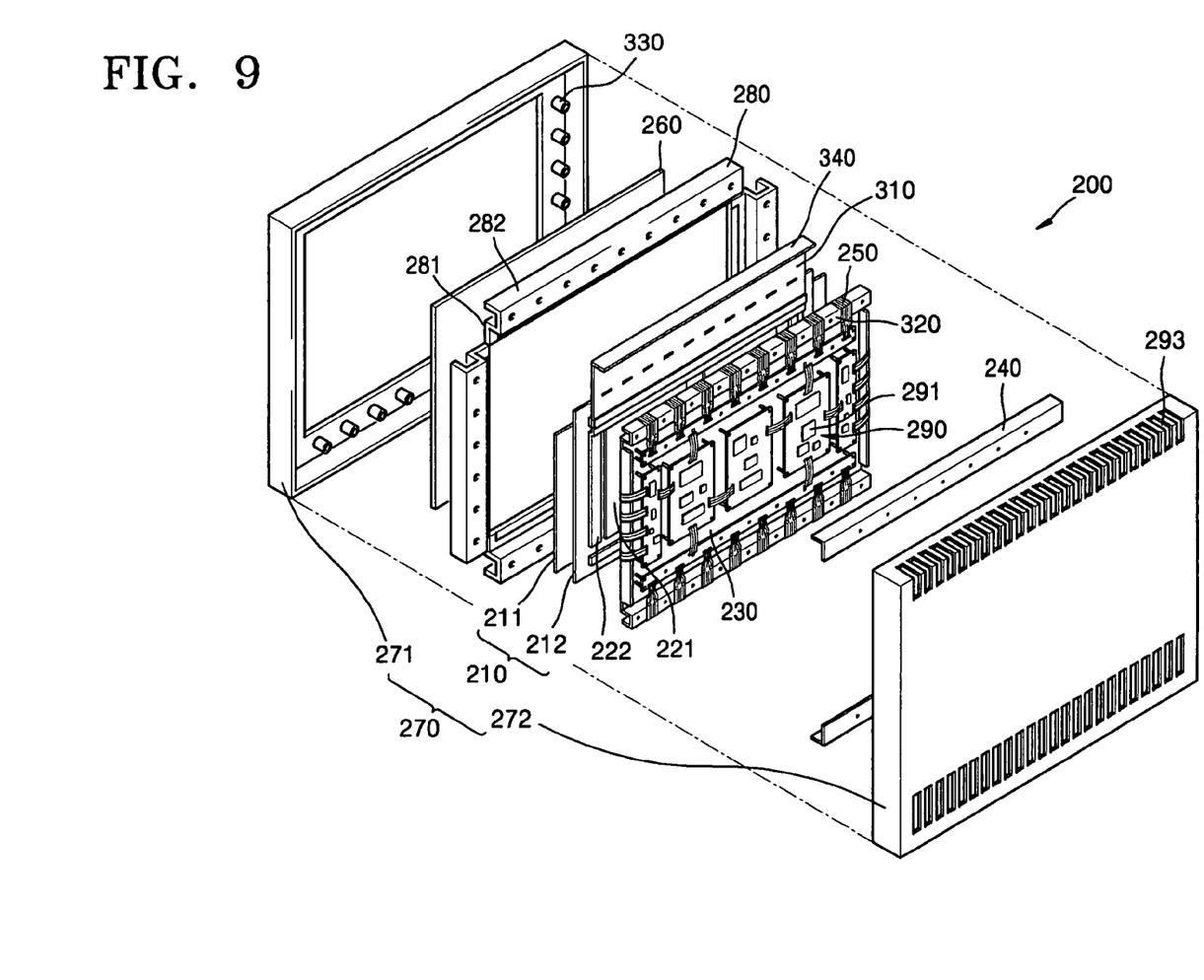
FIG. 9 is an exploded perspective view of a plasma display device according to an embodiment of the present invention.

FIG. 9 is an exploded perspective view of a plasma display device 200 according to an embodiment of the present invention. Referring to FIG. 9, the plasma display device 200 includes a panel assembly 210, a chassis base 230 coupled to the panel assembly 210, a plurality of driving circuit substrates 290 coupled to the chassis base 230, a plurality of flexible printed cables 250 that electrically connect the panel assembly 210 to the driving circuit substrates 290, a filter assembly 260 mounted in front of the panel assembly 210, and a case 270 that accommodates the remaining elements of the PDP device 200.

The panel assembly 210 includes a front panel 211 and a rear panel 212 coupled to the front panel 211. The front panel 211 includes a front substrate, X and Y electrodes patterned on the front substrate, a dielectric layer covering the X and Y electrodes, and a protection film layer coated on the surface of the dielectric layer. The rear panel 212 includes a rear substrate, a plurality of address electrodes perpendicular to the X and Y electrodes on the rear substrate, a dielectric layer covering the address electrodes, barrier ribs located between the front substrate and the rear substrate to define discharge spaces, and red, green, and blue phosphor layers coated on inner walls of the barrier ribs.

The chassis base 230 is coupled to the rear of the panel assembly 210. At least one heat dissipation sheet 221 and a double-sided tape 222 disposed along edges of the heat dissipation sheet 221 are located between the panel assembly 210 and the chassis base 230. Also, a heat dissipation element 310 having a heat sink 340 is interposed between the heat dissipation sheet 221 and the double-sided tape 222.

The chassis base 230 is a plate formed of a high heat radiation metal, and the driving circuit substrates 290 are mounted on the rear surface of the chassis base 230. The driving circuit substrates 290 include a plurality of electronic parts 291.

Also, the chassis base 230 can further include a chassis base reinforcing member 320 formed in a striped shape to reinforce the chassis base 230 or a cover plate 240 disposed a predetermined distance from the chassis base 230 to protect upper and lower ends of the chassis base 230.

The flexible printed cables 250 are located between the chassis base 230 and the cover plate 240. The flexible printed cables 250 electrically connect terminals of electrodes of the panel assembly 210 to the driving circuit substrates 290.

A filter assembly 260 is mounted in front of the panel assembly 210. The filter assembly 260 shields electromagnetic waves, ultraviolet rays, or neon light generated by the panel assembly 210 and prevents the reflection of external light.

The filter assembly 260 includes a reflection protection film on a transparent substrate to prevent visibility reduction by the reflection of external light. The filter assembly 260 also includes an electromagnetic shielding layer for effectively shielding electromagnetic waves generated during the operation of the panel assembly 210, and a selected wavelength absorption film for shielding near infrared rays produced by plasma of an inert gas used to emit neon light and display an image.

The panel assembly 210, the chassis base 230, the driving circuit substrate 290, and the filter assembly 260 are accommodated in the case 270. The case 270 includes a front cabinet 271 mounted in front of the filter assembly 260 and a back cover 272 mounted behind the driving circuit substrates 290. A plurality of vent holes 293 are formed on upper and lower edges of the back cover 272.

A filter holder 280 is mounted on a rear surface of the filter assembly 260. The filter holder 280 includes a press portion 281 that presses the filter assembly 260 toward the front cabinet 271 and a fixing portion 282 bent toward the panel assembly 210 from the press portion 281.

Filter mounting units 330 are formed on rear edges of the front cabinet 271. The filter mounting units 330 faces the fixing portion 282 and fix the filter assembly 260 to the front cabinet 271.

In embodiments of the present invention, a carbon group thermal conductive sheet (a graphite sheet or a carbon sheet) interposed between a chassis base and panel can help stabilize driving pulses. In this way, inductance between the panel and the chassis base can be reduced. The inductance L is given by the following equation.

$$\text{Total inductance } L = 2 \times L_{pcb} + 2 \times L_{FPC} + L_{pdp\ II\ gnd} L_{pdp\ II}$$
$$gnd = \mu_0 \times \text{Length of PDP} \times \text{Gap between the two panels/Width of PDP} = 1.26 \times (\text{Length of PDP} \times \text{Gap between the two panels/Width of PDP})[\mu H] \quad \text{[Equation]}$$

In embodiments of the present invention, instability of a panel discharge is prevented by reducing the inductance between the chassis base and the panel since the inductance generates the electromotive force and the electromotive force affects the driving waveforms.

Figure 3:
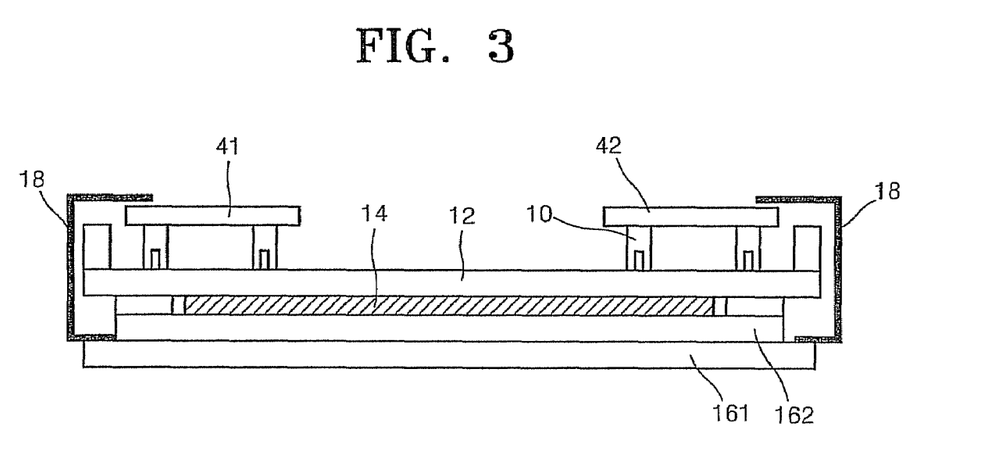
FIG. 3 is a cross-sectional view of a PDP according to an embodiment of the present invention.

Referring to FIG. 3, a carbon group thermal conductive sheet (a graphite sheet or a carbon sheet) 14 is inserted between a chassis base 12 and panels 161 and 162, and is grounded to the chassis base 12 through an electrical connection to the chassis base 12. The carbon group thermal conductive sheet (grounding) tightly contacts the rear surface of the panel 162 to rapidly distribute heat generated from the panels 161 and 162 along a width direction of the panels 161 and 162. Therefore, the temperature of the panels 161 and 162 is held constant. Also, the carbon group thermal conductive sheet serves as a ground GND by tightly contacting the rear surface of the panel 162. Therefore, inductance between the chassis base 12 and the panel 162 is reduced, and thus, the affect of an electromotive force on driving waveforms is prevented.

When the PDP depicted in FIG. 3 is operated, a current flows along the following path: Y driving board 42→ signal transmitting element 18→ panel electrodes 161 and 162→ signal transmitting element 18→ X driving board 41→ chassis 12 and 10→ Y driving board 42. In this case, an electromotive force that can affect the driving waveforms is induced between electrodes. To prevent the instability of a panel discharge due to the effect on the driving waveforms by the electromotive force, the carbon group thermal conductive sheet 14 is inserted between the chassis base 12 and the panels 161 and 162 and is grounded to the chassis base 12.

Figure 4:
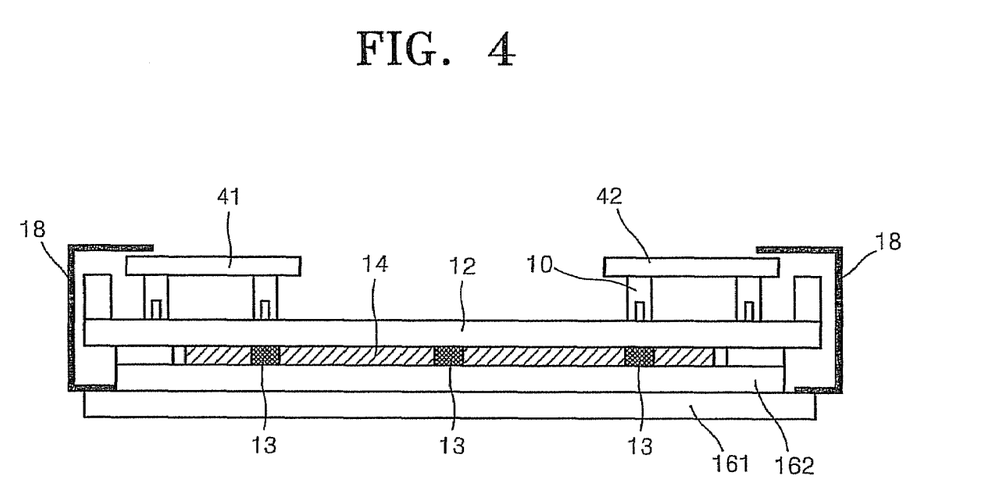
FIG. 4 is a cross-sectional view of a PDP according to another embodiment of the present invention.

Referring to FIG. 4, when the carbon group thermal conductive sheet 14 is divided into more than two pieces for convenience of assembly, the pieces are connected to each other by a conductive element 13, and the carbon group thermal conductive sheet 14 is grounded to the chassis base 12.

The conductive element 13 can be an EMI sponge, a silicon sponge (in which the surface of silicon is covered by a conductive mesh), a neoprene sponge (in which the surface of neoprene rubber is covered by a conductive mesh), or an element in which a Cu or Al sheet is coupled to a buffering thermal conductive sheet. The conductive element 13 according to an embodiment of the present invention is not limited thereto, and, to increase workability, an adhesive can be formed on both surfaces of the conductive element 13.

Figure 6:
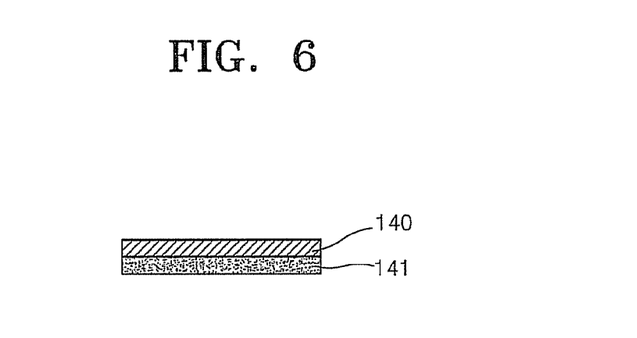
FIG. 6 is a cross-sectional view of a thermal conductive sheet of a structure for stabilizing drive pulses of a PDP according to an embodiment of the present invention.
Figure 7:
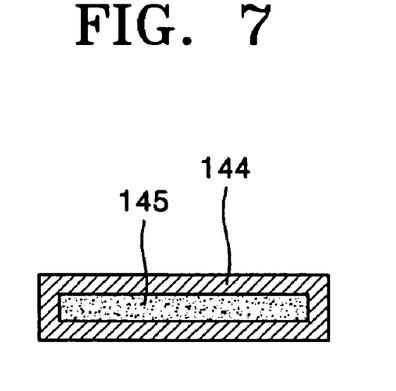
FIG. 7 is a cross-sectional view of a thermal conductive sheet of a structure for stabilizing drive pulses of a PDP according to another embodiment of the present invention.
Figure 8:
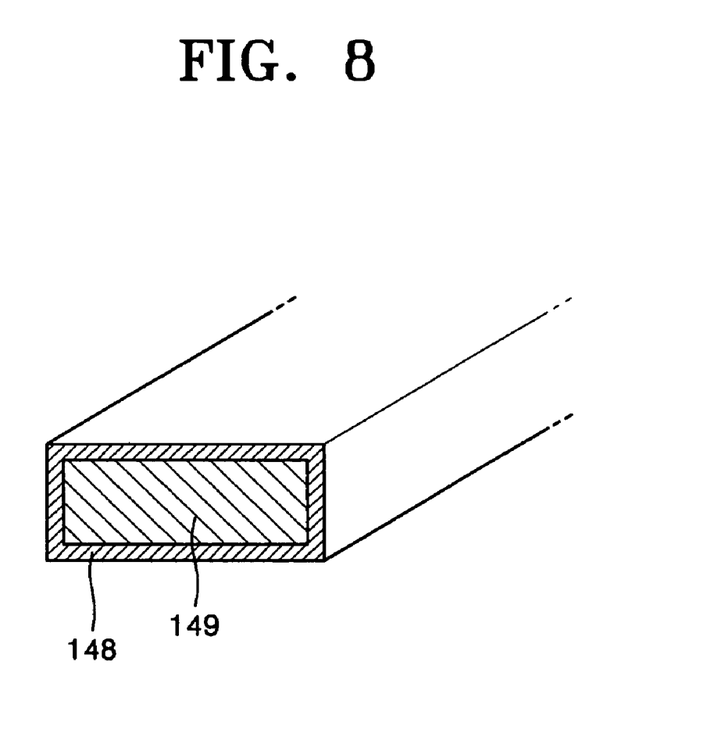
FIG. 8 is a cross-sectional view of a thermal conductive sheet of a structure for stabilizing drive pulses of a PDP according to another embodiment of the present invention.

The conductive substance can be a Cu, Al, graphite, or BeCu mesh, and the buffering material can be silicon, rubber, a resin foam, or a sponge. Also, as depicted in FIG. 6, the conductive element 13 can be formed by coating a conductive element 140 on a buffering material 141, which is a buffering thermal conductive sheet. Also, as depicted in FIG. 7, the conductive element 13 can be formed by surrounding a buffering material 145 with a conductive element 144. Alternatively, as depicted in FIG. 7, the conductive element 13 can be formed by surrounding a buffering material 149 with a mesh type conductive element 148.

Figure 5:
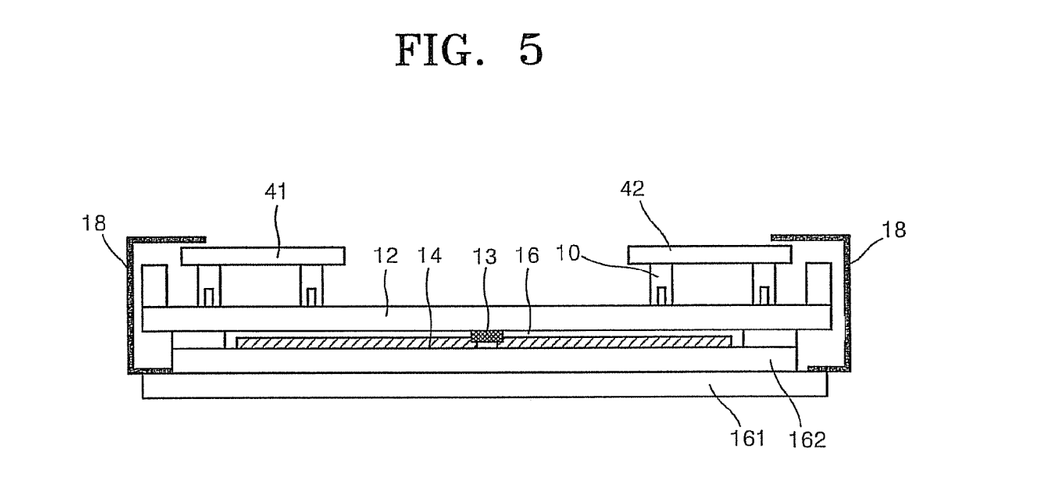
FIG. 5 is a cross-sectional view of a PDP according to another embodiment of the present invention.

According to an embodiment of the present invention, as depicted in FIG. 5, a gap 16 is provided between the chassis base 12 and the carbon group thermal conductive sheet 14 to prevent the transferring of heat generated by the driving circuit substrates 41 and 42 to the panels 161 and 162. The gap may be an air layer.

As described above, a carbon group thermal conductive sheet (a graphite sheet or a carbon sheet) is inserted between panels and a chassis base, and is grounded to the chassis base to reduce inductance between the chassis base and the panels. Accordingly, the electromotive force is reduced, and thus, driving pulses are not affected, thereby enabling a stable panel discharge. Also, the temperature of the panels is uniformly distributed over the panels since the carbon group thermal conductive sheet tightly contacts the rear surface of the panels rapidly transferring heat generated from the panel along a width direction of the panels.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A structure stabilizing drive pulses of a plasma display device, the structure comprising:
    a panel;
    a chassis base which is mounted on an upper part of the panel to form a current path and dissipate heat;
    a case which dissipates the heat in connection with the chassis base;
    a chassis reinforcing member mounted on an upper part of the chassis base;
    a driving circuit substrate mounted on an upper part of the chassis reinforcing member;
    a signal transmitting element that transmits signals between the driving circuit substrate and the panel;
    a carbon group thermal conductive sheet that is interposed between the panel and the chassis base to electrically connect the panel to the chassis base, and is grounded to the chassis base; and
    a conductive element, wherein the carbon group thermal conductive sheet is divided into more than two pieces, and the divided pieces are connected to each other by the conductive element.

2. The structure stabilizing drive pulses of claim 1, wherein the conductive element is an EMI sponge, a silicon sponge, neoprene, a Cu or Al sheet, graphite, or a BeCu mesh.

3. The structure stabilizing drive pulses of claim 1, wherein the conductive element comprises:
    a buffering material which is thermal conductive and acts as a buffer; and
    a conductive material coated on the buffering material.

4. The structure stabilizing drive pulses of claim 1, wherein the conductive element comprises:
    a buffering material; and
    a conductive material surrounding the buffering material.

5. The structure stabilizing drive pulses of claim 1, wherein the conductive element comprises:
    a buffering material; and
    a conductive mesh surrounding the buffering material.

6. The structure stabilizing drive pulses of claim 5, wherein the buffering material is silicon, a resin foam, or a sponge.

7. The structure stabilizing drive pulses of claim 1, wherein a gap is formed between the chassis base and the carbon group thermal conductive sheet to prevent the transfer of heat generated by the driving circuit substrate to the panel through the carbon group thermal conductive sheet.

8. A plasma display device having the structure stabilizing drive pulses of the plasma display device as recited in claim 1.

9. The plasma display device of claim 8, wherein the carbon group thermal conductive sheet contacts a rear surface of the panel to distribute heat generated by the panel along a width direction of the panel.

10. The plasma display device of claim 8, wherein the carbon group thermal conductive sheet is divided into at least two pieces and the pieces are connected to each other by a conductive element.

11. The plasma display device of claim 10, wherein the conductive element is an EMI sponge, a silicon sponge, a neoprene sponge or a Cu or Al sheet.

12. The plasma display device of claim 8, wherein a gap is provided between the chassis base and the carbon group thermal conductive sheet.

13. The plasma display device of claim 12, wherein the gap is an air layer.

14. A structure stabilizing drive pulses of a plasma display device, the structure comprising:
- a panel assembly;
- a chassis base mounted on one side of the panel to form a current path and dissipate heat;
- a chassis reinforcing member and a driving circuit substrate mounted on the chassis base
- a case housing the panel assembly and the chassis base; and
- a thermal conductive sheet interposed between the panel and the chassis base to electrically connect the panel to the chassis base and grounded to the chassis base, wherein the thermal conductive sheet includes a graphite sheet or a carbon sheet, and the thermal conductive sheet is divided into at least two pieces and the pieces are connected to each other by a conductive element.

15. The structure of claim 14, wherein the conductive element comprises:
- a buffering material; and
- a conductive mesh surrounding the buffering material.

16. The structure of claim 14, wherein the conductive element comprises:
- a buffering material; and
- a conductive material surrounding the buffering material.

17. The structure of claim 14, wherein the conductive element is an EMI sponge, a silicon sponge, a neoprene sponge or a Cu or Al sheet.

18. The structure of claim 14, wherein the conductive element comprises:
- a buffering material; and
- a conductive material coated on the buffering material.

* * * * *

UNITED STATES PATENT AND TRADEMARK OFFICE
CERTIFICATE OF CORRECTION

| | | |
|---|---|---|
| PATENT NO. | : 7,649,313 B2 | Page 1 of 1 |
| APPLICATION NO. | : 11/354857 | |
| DATED | : January 19, 2010 | |
| INVENTOR(S) | : Ki-Jung Kim et al. | |

It is certified that error appears in the above-identified patent and that said Letters Patent is hereby corrected as shown below:

Column 7, line 15, after "base" insert --;--.

Signed and Sealed this

Fourth Day of May, 2010

David J. Kappos
*Director of the United States Patent and Trademark Office*